US012746604B2

(12) United States Patent
Asanuma

(10) Patent No.: US 12,746,604 B2
(45) Date of Patent: Sep. 29, 2026

(54) SURFACE-COATED CUTTING TOOL

(71) Applicant: MITSUBISHI MATERIALS CORPORATION, Tokyo (JP)

(72) Inventor: Hidetoshi Asanuma, Tokyo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 405 days.

(21) Appl. No.: 18/282,610

(22) PCT Filed: Mar. 30, 2021

(86) PCT No.: PCT/JP2021/013515

§ 371 (c)(1),
(2) Date: Sep. 18, 2023

(87) PCT Pub. No.: WO2022/208654

PCT Pub. Date: Oct. 6, 2022

(65) Prior Publication Data

US 2024/0165713 A1 May 23, 2024

(51) Int. Cl.
*B32B 15/00* (2006.01)
*B23B 27/14* (2006.01)
(Continued)

(52) U.S. Cl.
CPC ............ *B23B 27/148* (2013.01); *B23B 27/14* (2013.01); *B23C 5/16* (2013.01); *B32B 3/14* (2013.01);
(Continued)

(58) Field of Classification Search
CPC ... B23B 2224/00; B23B 27/148; B23B 27/14; B23C 5/16; C22C 29/08; C22C 1/051;
(Continued)

(56) References Cited

U.S. PATENT DOCUMENTS 5,494,635 A * 2/1996 Bennett .................. C22C 1/056 419/57
6,033,734 A 3/2000 Muenz et al.
2021/0079504 A1 3/2021 Kido et al.

FOREIGN PATENT DOCUMENTS

JP H09-217168 A 8/1997
JP 2014-152345 A 8/2014
(Continued)

OTHER PUBLICATIONS

Supplementary European Search Report dated Nov. 28, 2024, issued for EP21 93 4826.

(Continued)

*Primary Examiner* — Michael E. La Villa
(74) *Attorney, Agent, or Firm* — Troutman Pepper Locke LLP

(57) ABSTRACT

A surface coated cutting tool comprising a substrate and a coating layer on the substrate, the substrate comprising a WC-based cemented carbide comprising a hard phase component of WC grains and a binder phase primarily composed of Co, wherein (a) an interfacial layer is disposed between the substrate and the coating layer;
(b) the interfacial layer includes a region A directly above the hard phase component and a region B directly above the binder phase, and the interfacial layer has an average thickness;
at the midpoint across the average thickness of the interfacial layer, the W content in the region A ranges from 90 to 99 mass %, while the W content in the region B ranges from 30 to 65 mass %,
the C content $C_A$ in the region A satisfies $C_A \leq 0.05$ mass %, and (Continued)

the C content $C_B$ in the region B satisfies $C_A \leq C_B \leq 0.09$ mass %.

2 Claims, 1 Drawing Sheet

(51) Int. Cl.

| | |
|---|---|
| ***B23C 5/16*** | (2006.01) |
| ***B32B 3/14*** | (2006.01) |
| ***B32B 3/18*** | (2006.01) |
| ***B32B 5/14*** | (2006.01) |
| ***B32B 15/04*** | (2006.01) |
| ***C22C 1/055*** | (2023.01) |
| ***C22C 27/04*** | (2006.01) |
| ***C22C 29/08*** | (2006.01) |
| ***C23C 14/02*** | (2006.01) |
| ***C23C 14/06*** | (2006.01) |
| ***C23C 14/32*** | (2006.01) |
| ***C23C 28/00*** | (2006.01) |
| ***C23C 28/02*** | (2006.01) |
| ***C23C 28/04*** | (2006.01) |
| ***C23C 30/00*** | (2006.01) |
| *B22F 3/24* | (2006.01) |
| *B22F 5/00* | (2006.01) |
| *C22C 1/051* | (2023.01) |

(52) U.S. Cl.

CPC .................. *B32B 3/18* (2013.01); *B32B 5/14* (2013.01); *B32B 15/00* (2013.01); *B32B 15/04* (2013.01); *B32B 15/043* (2013.01); *C22C 1/055* (2013.01); *C22C 27/04* (2013.01); *C22C 29/08* (2013.01); *C23C 14/022* (2013.01); *C23C 14/025* (2013.01); *C23C 14/0641* (2013.01); *C23C 14/325* (2013.01); *C23C 28/02* (2013.01); *C23C 28/021* (2013.01); *C23C 28/023* (2013.01); *C23C 28/027* (2013.01); *C23C 28/04* (2013.01); *C23C 28/042* (2013.01); *C23C 28/044* (2013.01); *C23C 28/30* (2013.01); *C23C 28/322* (2013.01); *C23C 28/324* (2013.01); *C23C 28/34* (2013.01); *C23C 28/347* (2013.01); *C23C 30/00* (2013.01); *C23C 30/005* (2013.01); *B22F 2003/242* (2013.01); *B22F 2005/001* (2013.01); *B23B 2224/00* (2013.01); *C22C 1/051* (2013.01); *Y10T 428/12576* (2015.01); *Y10T 428/12806* (2015.01); *Y10T 428/12826* (2015.01); *Y10T 428/1284* (2015.01); *Y10T 428/12847* (2015.01); *Y10T 428/2495* (2015.01); *Y10T 428/24959* (2015.01)

(58) Field of Classification Search

CPC ....... C22C 1/055; C22C 27/04; C23C 14/022; C23C 14/025; C23C 14/0641; C23C 14/325; C23C 28/02; C23C 28/021; C23C 28/023; C23C 28/027; C23C 28/04; C23C 28/042; C23C 28/044; C23C 28/30; C23C 28/322; C23C 28/324; C23C 28/34; C23C 28/347; C23C 30/00; C23C 30/005; B22F 2003/242; B22F 2005/001; B32B 15/00; B32B 15/04; B32B 15/043; B32B 3/18; B32B 3/14; B32B 5/14; Y10T 428/12806; Y10T 428/1284; Y10T 428/12847; Y10T 428/12576; Y10T 428/12826; Y10T 428/2495; Y10T 428/24959

See application file for complete search history.

(56) References Cited

FOREIGN PATENT DOCUMENTS

| | | | |
|---|---|---|---|
| JP | 2015-110256 | A | 6/2015 |
| JP | 2016-64487 | A | 4/2016 |
| JP | 6385233 | B2 | 9/2018 |
| JP | 2018-154917 | A | 10/2018 |
| JP | 2020-127998 | A | 8/2020 |
| WO | 2019/138599 | A1 | 7/2019 |
| WO | 2020/184352 | A1 | 9/2020 |

OTHER PUBLICATIONS

Office Action mailed Nov. 24, 2025, issued for Chinese Patent Application No. 202180096305.5 and English translation thereof.

Office Action mailed May 28, 2026, issued for Chinese Patent Application No. 202180096305.5 and English translation thereof.

* cited by examiner

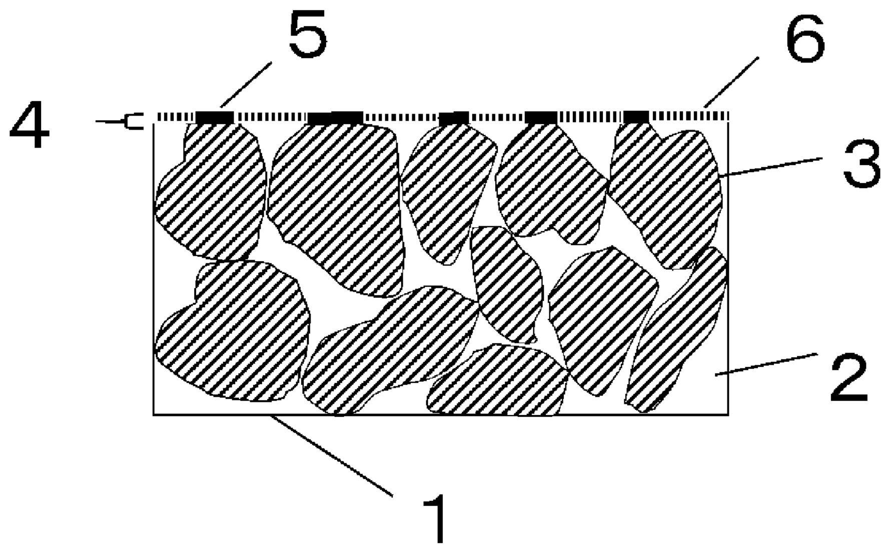
5
6
4
3
2
1

SURFACE-COATED CUTTING TOOL

TECHNICAL FIELDS

The present invention relates to a surface coated cutting tool (hereinafter, may also be referred to as coated tool).

BACKGROUND ART

Examples of known coated tools include inserts that are detachably mounted to tips of bites and are used for turning and milling of various types of steel, cast iron, and other work materials; drills and miniature drills that are used for drilling and cutting of work material; solid type end mills that are used for face milling, grooving and shoulder milling of work material; and insert end mills that are provided with detachably mounted inserts and are used for cutting, like solid end mills.

Coated tools are also known each includes a substrate made of WC-based cemented carbide and a coating layer on the substrate. Various proposals have been made to improve cutting performance by focusing on adhesion at the interface between the tool substrate and the coating layer (film).

For example, PTL 1 discloses a coated tool that includes a substrate, the surface of which is etched by Cr ions and/or Mo ion and a TiAlN layers formed on the etched substrate. The coated tool contains fewer droplets of Cr ions and/or Mo ions.

PTL 2 discloses a coated tool that includes a substrate of WC-based cemented carbide, a modifier phase having a bcc structure on the substrate, and a coating layer on the modifier phase. The modifier phase has a metal composition, besides incidental impurities, represented by the following formula:

$$W_{100-x-y}M_xCo_y$$

where M is at least one element selected from the group consisting of Cr, V, Ni, Fe, and Mn, Cr is an essential element constituting at least 70% by mass of all the M elements, and subscripts (100−x−y), x, and y representing the contents (mass %) of W, M, and Co elements are within the ranges $80 \le 100-x-y \le 95$, $5 \le x \le 20$, and $0.1 \le y \le 3$, respectively. The modifier phase is formed by ion bombardment treatment, and improves adhesion to the coating layer of the coated tool, and thus the coated tool can be used for cutting of hardened steel, stainless steel, and cast steel.

PTLs 3 and 4 each discloses a coated tool that includes a substrate and an intermediate layer on the substrate, where the intermediate layer has a thickness in the range of 1 nm to 10 nm and is composed of carbides of W and Cr indexed to the crystal structure of WC based on a nanobeam diffraction pattern. The intermediate layer improves the adhesion between the substrate and a coating layer formed on the intermediate layer, and thus contributes to an improvement in tool life of the coated tool in cutting of steel, cast iron, and heat-resistant alloys.

CITATION LIST

Patent Literature

[PTL 1] JP-H9-217168 A
[PTL 2] JP-2014-152345 A
[PTL 3] JP-2016-64487 A
[PTL 4] JP-6385233 B

SUMMARY OF INVENTION

Technical Problem

An object of the present invention, which has been made in view of the aforementioned circumstances and the aforementioned proposals, is to provide a cutting tool that demonstrates high welding and chipping resistances and thus has excellent cutting performance even over a long period of use for high-speed cutting of materials with low thermal conductivity and high toughness, such as titanium alloys and nickel alloys.

Solution to Problem

A surface coated cutting tool in accordance with an embodiment of the present invention includes a substrate and a coating layer on the substrate, the substrate comprising a WC-based cemented carbide comprising a hard phase component of WC grains and a binder phase mainly composed of Co, wherein (a) an interfacial layer is disposed between the substrate and the coating layer;

(b) the interfacial layer includes a region A that has a W content $W_A$ and a C content $C_A$ directly above the hard phase component and a region B that has a W content $W_B$ and a C content $C_B$ directly above the binder phase, and the interfacial layer has an average thickness;

at the midpoint across the average thickness of the interfacial layer, the W content $W_A$ in the region A is in the range of 90 to 99 mass %, while the W content $W_B$ in the region B is in the range of 30 to 65 mass %, the C content $C_A$ in the region A satisfies the expression: $C_A \le 0.05$ mass %, and the C content $C_B$ in the region B satisfies the expression: $C_A \le C_B \le 0.09$ mass %.

The surface coated cutting tool in accordance with the embodiment described above may satisfy the following restriction (1):

(1) The region A further contains 1 to 10 mass % Cr, and the region B further contains 30 to 60 mass % Co and 5 to 10 mass % Cr.

Advantageous Effects

The coating layer of the cutting tool described above demonstrates high welding and chipping resistances and thus has excellent cutting performance even over a long period of use for high-speed cutting of difficult-to-cut materials, such as titanium alloys and nickel alloys.

BRIEF DESCRIPTION OF DRAWING

FIG. 1 is an exemplary schematic diagram illustrating a substrate and an interfacial layer in a longitudinal cross section perpendicular to the surface of the substrate in a surface coated cutting tool in accordance with an embodiment of the present invention.

DESCRIPTION OF EMBODIMENTS

In recent years, versatile cutting tools have been demanded that can accommodate faster and more efficient cutting operations and that can cut as many types of materials as possible.

The present inventor has found, as a result of review, that the conventional coated tools disclosed in PTLs 1 to 4 do not cause any particular problem during use for cutting of steel or cast iron under normal cutting conditions, but undergo ready delamination of the coating layers and also accelerated wear progression due to repeated formation and detachment of weldment of work materials to cutting edges during use for high-speed cutting of difficult-to-cut materials such as Ti alloys and Ni alloys. The inventor has accordingly concluded the following statements 1) and 2):

1) In the coated tool described in PTL 1, the etching treatment of the surface of the substrate is aimed at preventing an increase in surface roughness through reductions in droplets, but is not directly aimed at preventing delamination of the coating layer.

2) The modifier phases and intermediate layers described in PTLs 2 to 4 are provided to improve the adhesion between the substrate (cemented carbide substrate) and the coating layer; however, they are not envisioned to be applied to high-speed cutting of difficult-to-cut materials such as Ti alloys and Ni alloys.

In light of these findings, the present inventor has conducted intensive research to develop a coated tool that demonstrates high delamination resistance of the coating layer especially under high-speed cutting of difficult-to-cut materials such as Ti alloys and Ni alloys, and thus exhibits high wear resistance over a long period of use.

In other words, the inventor has found that the adhesion of the coating layer to the hard phase (WC grains) differs in quality from the adhesiveness to the binder phase in a substrate composed of WC-based cemented carbide, and has further continued a series of studies on the interfacial layer between the coating layer and the substrate.

As a result, the inventor has arrived at the following new findings:

1) A reduction in C content in the interfacial layer to a significantly low level causes the adhesion between the substrate and the coating layer to improve, and thus the resulting coated tool has a satisfactory service life without delamination of the coating layer even in use for high-speed cutting of difficult-to-cut materials such as Ti alloys and Ni alloys; and 2) In this case, it is preferable that the C content should be lower in a portion in contact with the hard phase (WC grains) than in a portion in contact with the binder phase, on the surface of the substrate.

The inventor also has found that such a variable C content in the interfacial layer can be achieved through control of the bombardment treatment of the substrate with metal ions under specific conditions.

The surface coated cutting tool in accordance with the embodiment of the present invention will now be described in more detail. Throughout the specification and claims, a numerical range expressed by "X to Y" indicates that the numerical range includes the upper limit (Y) and lower limit (X) and the upper limit (Y) and lower limit (X) are in the same units. The numerical values inevitably have tolerances.

1. Substrate:

The substrate of the surface coated cutting tool in accordance with the embodiment of the present invention may be composed of any material including a hard phase component of WC grains and a binder phase mainly composed of Co without any restriction.

The reason for the expression "mainly composed of Co" for the binder phase is that the WC-based cemented carbide used in the substrate of the present invention may also contains components, such as TiC, VC, TaC, NbC, and $Cr_3C_2$, which are contained in usual WC-based cemented carbides in the form of dispersion or solid solution in such a phase.

The W content in the WC-based cemented carbide should preferably be 85 to 95 mass %, and the Co content, which is the main component of the binder phase, should preferably be 4 to 14 mass %.

2. Interfacial Layer

The surface coated cutting tool in accordance with an embodiment of the present invention should preferably have an interfacial layer between the substrate and the coating layer.

(1) Structure of Regions in Interfacial Layer

The interfacial layer has regions A directly above the hard phase component (WC grains) that constitutes the substrate and a region B directly above the binder phase that also constitutes the substrate.

The regions A directly above the hard phase components (WC grains) constituting the substrate indicate the regions of the interfacial layer that extend from portions in contact with the hard phase component (WC grains) of the surface of the substrate to the top of the interfacial layer (interface in contact with the coating layer) across its thickness.

The region B directly above the binder phase constituting the substrate indicates the region of the interfacial layer extend from portions in contact with the binder phase of the surface of the substrate to the top of the interfacial layer (interface in contact with the coating layer) across its thickness.

FIG. 1 schematically illustrates geometries of the substrate (1) and the regions A (5) and B (6) of the interfacial layer (4), where reference numeral (2) represents a binder phase and reference numeral (3) represents WC grains in the substrate (1). In FIG. 1, the coating layer is not depicted.

(2) Composition

At the midpoint across the average thickness of the interfacial layer, the W content $W_A$ in the region A is preferably in the range of 90 to 99 mass %, while the W content $W_B$ in the region B is preferably in the range of 30 to 65 mass %.

Furthermore, the C content $C_A$ in the region A and the C content $C_B$ in the region B at the same location preferably satisfies the following relations:

$C_A \leq 0.05$ mass %, and $C_A \leq C_B \leq 0.09$ mass %, where the lower limits of $C_A$ and $C_B$ may be less than the analytical limits, and thus they are treated as $C_A = C_B$ in such a case.

In order to form the interfacial layer by ion bombardment treatment using Cr ions as described below, it is more preferable that the Cr content be 1 to 10 mass % in the region A and 5 to 10 mass % in the region B.

Similarly, it is more desirable that the region B contain 30 to 60 mass % Co.

The reason why the aforementioned ranges of the C, W, Co, and Cr contents in the regions A and B are preferred are explained below. The locations at the midpoint across the average thickness of the interfacial layer are determined independently for each of the regions A and the region B. Thus, the locations of the regions A and B are not necessarily the same.

(2-1) Region A

The reason why the above range is preferred for the W content $W_A$ is as follows: A W content $W_A$ of less than 90 mass % leads to insufficient adhesion between the hard phase component (WC grains) in the region A and the interfacial region, whereas a W content $W_A$ exceeding 99 mass % leads to a reduction in the W content in the substrate and thus an increased number of cavities (voids) in the substrate, resulting in decreases in wear resistance and toughness of the substrate itself. A W content $W_A$ of 93 to 96 mass % is more preferable.

The C content $C_A$ should preferably be less in order to improve the adhesion between the hard phase component (WC grains) and the interface layer in the region A. The upper limit should preferably be 0.05 mass %, which is less than the C content $C_B$ in the region B. The lower limit may be below the analytical limit (i.e., the region A may be completely free of C).

A Cr content within the above range leads to a further improvement in adhesion between the coating layer and the interfacial layer, effectively preventing embrittlement at the surface of the substrate. A Cr content of 3 to 7 mass % is even more preferable.

(2-2) Region B

The reason why the above range is preferred for the W content $W_B$ is as follows: A $W_B$ of less than 30 mass % leads to insufficient adhesion between the binder phase and the interfacial layer in the region B, whereas a $W_B$ exceeding 65 mass % leads to a reduction in W content in the substrate and an increased number of cavities (voids) in the substrate, resulting in decreases in wear resistance and toughness of the substrate itself. A $W_B$ of 40 to 60 mass % is more preferable.

A C content $C_B$ exceeding 0.09 mass % leads to an excess amount of reduction in C content at the surface of the substrate, which causes an embrittlement zone to be formed on the surface of the substrate. The lower limit of the C content may be less than the analytical limit (i.e., the region B may be completely free of C).

A Cr content within the above range leads to a further improvement in adhesion between the coating layer and the interfacial layer, effectively preventing embrittlement at the surface of the substrate. A Cr content of 6 to 9 mass % is more preferable.

A Co content within the above range also leads to a further improvement in adhesion between the binder phase and the interfacial layer, preventing decreases in fracture and chipping resistances of the substrate due to a sufficient Co content in the substrate.

Although it is not clear why the coating layer has high cutting performance, such as high welding and chipping resistances even over a long period of use of the surface coated cutting tool in accordance with an embodiment of the present invention for high-speed cutting of difficult-to-cut materials such as titanium alloys and nickel alloys, it is assumed that Cr is present in the form of WCr, the W phase and WCr phase are independently present, the C content is low in the interfacial layer (suggesting almost no carbides), and combination of these phenomena contributes to an improvement in the toughness of the coating layer.

(3) Average Thickness

The interfacial layer should preferably have an average thickness in the range of 1 to 500 nm. An average thickness less than 1 nm leads to an insufficient improvement in adhesion between the surface of the substrate and the coating layer, whereas an average thickness exceeding 500 nm leads to embrittlement of the surface of the substrate during formation of the interfacial layer and thus ready delamination of the coating layer. An average thickness of 1 to 250 nm is more preferable, and 5 to 50 nm is even more preferable.

(4) Measurement

The measurements of the composition and average thickness of the interfacial layer will now be described.

(4-1) Composition of the Region a Immediately Above Hard Phase Component (WC Grains) Constituting Substrate The composition of the region A is determined by TEM-EDS line analysis with an energy dispersive X-ray spectrometer attached to a transmission electron microscope over a length of at least 550 nm in a longitudinal cross-section perpendicular to the substrate surface (across the thickness) from the coating layer directly above the hard phase component (WC grains) to the interior of the substrate.

Since the coating layer is a nitride layer as described below, the point at which N is no longer detected is defined as the end, adjacent to the surface of the tool, of the interfacial layer, while the point at which only W and C are detected simultaneously is defined as the end, adjacent to the substrate, of the interfacial layer, and the W, Cr, and C contents are measured at the midpoint (1/2 position) between these two ends.

The line analysis is performed at at least five positions directly above the hard phase component (WC grains), and these measurements are averaged to determine the composition of the region A.

The longitudinal section is a cross-section perpendicular to the flat surface of the substrate, defined by ignoring minute irregularities on the surface of the substrate, for an insert, or perpendicular to the axis for a shaft tool such as a drill.

(4-2) Composition of Region B Immediately Above Binder Phase Constituting Substrate The composition of the region B is determined by TEM-EDS line analysis over a length of at least 550 nm in a longitudinal cross-section from the coating layer immediately above the binder phase component to the interior of the substrate. The point at which N is no longer detected is defined as the end, adjacent to the surface of the tool, of the interfacial layer, while the point at which W is not detected and Co is detected is defined as the end, adjacent to the substrate, of the interfacial layer. The W, Cr, C, and Co contents are measured at the midpoint (1/2 position) between these two ends.

The line analysis is performed at at least five positions directly above the binder phase, and these measurements are averaged to determine the composition of the region B.

For determination of the compositions of regions A and B, if the result of the line analysis indicates the presence of a region where only the metal (e.g., Cr) used in the bombardment treatment is detected, this result is not adopted because droplets of this metal have been generated. Instead, another line analysis is performed.

(4-3) Average Thickness

As mentioned above, the average thickness represents the average of the distances between the ends adjacent to the surface of the substrate and the ends adjacent to the substrate, measured at five points in the region A and at five points in the region B.

(5) Production

The interfacial layer can be formed by bombardment treatment with metal ions. An example of metal is Cr, which barely forms droplets. Mo, which barely forms droplets, and Ti, which is often used for bombardment, can also be used, besides Cr. The use of a metal barely forming droplets will result in a smoother surface of the substrate, which in turn prolongs the life of the surface coated cutting tool. The bombardment treatment should preferably be performed at a process temperature higher than that performed in usual processes.

Although it is not clear at this point why two regions A and B having different compositions are formed by the bombardment treatment, it is assumed that gases such as Ar introduced during the bombardment treatment at high temperature are ionized and thus the surface of the substrate is irradiated with an increased amount of ions, thereby promoting the selective diffusion and reaction of atoms due to the difference in composition.

3. Coating Layer

The coating layer may be composed of any known composite nitride containing metal with the proviso that it does not hinder the achievement of the aforementioned purpose. Examples include composite nitrides of Ti and Al, composite nitrides of Ti, Al, and Cr, composite nitrides of Ti, Al, and Si, and composite nitrides of Al and Cr.

The deposited coating layer should preferably have an average thickness in the range of 0.5 to 10.0 μm. An average thickness of less than 0.5 μm fails to exhibit high wear resistance over a long period of use of the tool, resulting in a short service life, whereas an average thickness of greater than 10 μm causes a risk of abnormal damage, such as chipping and fracturing.

The average thickness is determined through averaging measurements at five points in a longitudinal cross-section at an appropriate magnification (e.g., 5,000 times).

The coating layer may be deposited by either a known PVD or CVD process. For a PVD process, an arc ion plating system (AIP system) is preferably used.

Examples

Examples will now be described.

The examples of the coated tool of the present invention described here is applied to an insert cutting tool. A requirement for the coated tool is to contain WC in a substrate, as described above, and this is similar to the case applied to a drill or an end mill as the coated tool. Although the coating layer has a composition represented by the formula: $(Ti_{(1-x-y)}Al_xM_y)N$, (where $0.35 \le x \le 0.80$, $0.00 \le y \le 0.15$ where x and y are atomic ratios and M is at least one atom selected from the group consisting of groups 4 to 6 elements, Ce, La, Hf, and Nd in the IUPAC periodic table) in one embodiment, it may have any other composition.

Co, VC, $Cr_3C_2$, TiC, TaC, NbC, and WC raw material powders were provided, and these raw material powders were blended according to formulations shown in Table 1. After wax was added, each blend was wet-mixed in a ball mill for 72 hours, was dried under reduced pressure, and was compacted at a pressure of 100 MPa. The green compact was sintered and machined to specified dimensions. Substrates 1 to 3 of WC-based cemented carbide with insert shapes as specified in the ISO standard SEEN1203AFTN1 were thereby produced.

Substrates 1 to 3 were each ultrasonically cleaned in acetone, were dried, and were mounted along the periphery at a predetermined distance in the radial direction from the central axis on the turn table in the AIP system. A Cr target, a Ti target, and a Mo target were disposed for a cathode (evaporation source), while a Ti—Al-M alloy target was placed to form a coating of a predetermined composition.

The interior of the deposition system was heated to 960 to 1100° C. with a heater while the interior of the system was evacuated to a vacuum below $10^{-2}$ Pa. As shown in Table 2, the system was set at an inert atmosphere of 0.1 to 2.0 Pa, a DC bias voltage of −1000 to −1600 V was applied to the substrate revolving on the rotating turn table, and the surface of the substrate was bombarded by Cr, Ti, or Mo ions for 5 to 40 min.

As shown in Table 2, nitrogen gas with a pressure in the range of 1.0 to 5.0 Pa was introduced for a predetermined time, and a predetermined current in the range of 80 to 240 A shown in Table 2 was applied between the cathode (evaporation source) made of Ti—Al-M alloy target and the anode to generate an arc discharge. Inventive Coated Tools (hereinafter referred to as "Examples") 1 to 9 shown in Table 3 were thereby fabricated.

For comparison, an interfacial layer and a coating layer were deposited on each of Substrates 1 to 3 in the same deposition system under the conditions shown in Table 2 to produce comparative example coated tools (hereinafter referred to as "Comparative Examples") 1 to 4 shown in Table 4.

Examples 1 to 9 and Comparative Examples 1 to 4 were each subjected to measurements of the average thickness and composition of the interfacial layer as described above. The results are shown in Tables 3 and 4. Measurements in Tables 3 and 4 are averages.

TABLE 1

| | Composition (mass %) | | | | | | |
|---|---|---|---|---|---|---|---|
| Substrate | Co | TiC | VC | TaC | NbC | $Cr_3C_2$ | WC |
| 1 | 5.5 | — | 0.2 | — | 0.3 | — | Balance |
| 2 | 10.0 | — | 1.0 | — | — | 0.8 | Balance |
| 3 | 12.0 | 0.6 | — | 0.6 | 0.8 | — | Balance |

Symbol "—" indicates not contained.

TABLE 2

| | | | Conditions of bombardment | | | | | | Conditions for formation of hard coating layer | | | |
|---|---|---|---|---|---|---|---|---|---|---|---|---|
| Type | | Substrate | Target | Temp. (° C.) of substrate during bombardment | Furnace atmosphere | Pressure in furnace (Pa) | Bias voltage (V) to substrate | Bombarding time (min) | Composition of Ti—Al—M alloy target | $N_2$ pressure (Pa) | Arc current (A) | DC bias voltage (V) |
| Example | 1 | 1 | Cr | 960 | Ar | 0.1 | −1000 | 40 | $Ti_{0.4}Al_{0.58}Ce_{0.02}$ | 1.0 | 120 | −30 |
| | 2 | 2 | Cr | 1100 | Kr | 2.0 | −1600 | 5 | $Ti_{0.4}Al_{0.5}Cr_{0.1}$ | 5.0 | 80 | −150 |
| | 3 | 3 | Cr | 1000 | Xe | 0.2 | −1500 | 20 | $Ti_{0.4}Al_{0.5}Si_{0.1}$ | 3.0 | 240 | −80 |
| | 4 | 1 | Cr | 1050 | Ar | 0.5 | −1000 | 25 | $Ti_{0.3}Al_{0.7}$ | 2.5 | 220 | −30 |
| | 5 | 2 | Cr | 980 | Kr | 1.5 | −1200 | 30 | $Ti_{0.45}Al_{0.55}$ | 3.5 | 200 | −100 |
| | 6 | 3 | Cr | 1000 | Ar | 2.0 | −1100 | 25 | $Ti_{0.3}Al_{0.6}W_{0.1}$ | 4.0 | 80 | −75 |
| | 7 | 1 | Cr | 1100 | Ar | 0.5 | −1000 | 20 | $Ti_{0.4}Al_{0.5}B_{0.1}$ | 4.5 | 180 | −55 |
| | 8 | 2 | Mo | 1050 | Ar | 1.2 | −1600 | 35 | $Ti_{0.5}Al_{0.4}Nb_{0.1}$ | 2.5 | 220 | −60 |
| | 9 | 3 | Ti | 1080 | Ar | 0.1 | −1000 | 40 | $Ti_{0.3}Al_{0.5}Cr_{0.2}$ | 2.0 | 200 | −45 |
| Comparative | 1 | 1 | Cr | 500 | Ar | 3.0 | −800 | 30 | $Ti_{0.5}Al_{0.5}$ | 3.0 | 150 | −30 |
| Example | 2 | 2 | Cr | 450 | Ar | 0.1 | −500 | 2 | $Ti_{0.5}Al_{0.4}Si_{0.1}$ | 3.5 | 80 | −150 |

TABLE 2-continued

| Type | Substrate | Target | Conditions of bombardment: Temp. (° C.) of substrate during bombardment | Furnace atmosphere | Pressure in furnace (Pa) | Bias voltage (V) to substrate | Bombarding time (min) | Conditions for formation of hard coating layer: Composition of Ti—Al—M alloy target | $N_2$ pressure (Pa) | Arc current (A) | DC bias voltage (V) |
|---|---|---|---|---|---|---|---|---|---|---|---|
| 3 | 3 | Cr | 900 | None | Vaccum | −1000 | 45 | $Ti_{0.4}Al_{0.5}Cr_{0.1}$ | 5.0 | 100 | −75 |
| 4 | 1 | Cr | 900 | Kr | 1.0 | −800 | 35 | $Ti_{0.3}Al_{0.7}$ | 2.5 | 120 | −50 |

TABLE 3

| Type | | Substrate | Interfacial layer: Thickness (nm) | Region A: $W_A$ (mass %) | $C_A$ (mass %) | Cr (mass %) | Ti (mass %) | Mo (mass %) | Region B: $W_B$ (mass %) | $C_B$ (mass %) | Cr (mass %) | Ti (mass %) | Mo (mass %) | Co (mass %) | Hard coating layer Thickness (μm) |
|---|---|---|---|---|---|---|---|---|---|---|---|---|---|---|---|
| Example | 1 | 1 | 50 | 99 | 0.00 | 1 | — | — | 65 | 0.00 | 5 | — | — | 30 | 1.0 |
| | 2 | 2 | 1 | 91 | 0.01 | 9 | — | — | 35 | 0.02 | 10 | — | — | 55 | 10.0 |
| | 3 | 3 | 5 | 90 | 0.00 | 10 | — | — | 30 | 0.00 | 10 | — | — | 60 | 0.5 |
| | 4 | 1 | 450 | 94 | 0.02 | 6 | — | — | 48 | 0.02 | 7 | — | — | 45 | 4.0 |
| | 5 | 2 | 20 | 97 | 0.03 | 3 | — | — | 45 | 0.05 | 5 | — | — | 50 | 0.5 |
| | 6 | 3 | 250 | 92 | 0.01 | 8 | — | — | 31 | 0.01 | 9 | — | — | 60 | 10.0 |
| | 7 | 1 | 500 | 93 | 0.02 | 7 | — | — | 42 | 0.03 | 8 | — | — | 50 | 2.0 |
| | 8 | 2 | 300 | 90 | 0.05 | — | — | 10 | 61 | 0.09 | — | — | 9 | 30 | 3.0 |
| | 9 | 3 | 150 | 92 | 0.03 | — | 8 | — | 35 | 0.03 | — | 10 | — | 55 | 5.0 |

"0.00" indicates less than the analytical limit.
Symbol "—" indicates not used as a target.

TABLE 4

| Type | | Substrate | Interfacial layer: Thickness (nm) | Region A: $W_A$ (mass %) | $C_A$ (mass %) | Cr (mass %) | Region B: $W_B$ (mass %) | $C_B$ (mass %) | Cr (mass %) | Co (mass %) | Hard coating layer Thickness (μm) |
|---|---|---|---|---|---|---|---|---|---|---|---|
| Comparative Example | 1 | 1 | 10 | 90 | 0.06 | 10 | 75 | 0.02 | 15 | 10 | 5.0 |
| | 2 | 2 | 0 | Interfacial layer was not formed. | | | | | | | 3.0 |
| | 3 | 3 | 150 | 82 | 3.00 | 15 | 3 | 2.00 | 25 | 70 | 2.5 |
| | 4 | 1 | 5 | 85 | 0.02 | 15 | 40 | 0.01 | 20 | 40 | 5.0 |

The coated tools of Examples 1 to 9 and Comparative Examples 1 to 4 were subjected to single-blade front-face milling tests with a SE445R0506E cutter. A nickel alloy and a titanium alloy were served to high-speed milling tests under the following cutting conditions:

Cutting Condition A:

Workpiece: A block of 60 mm wide by 200 mm long Ni-based alloy having a composition of Ni (base), 19% Cr, 18.5% Fe, 5.2% Cd, 5% Ta, 3% Mo, 0.9% Ti, 0.5% Al, 0.3% Si, 0.2% Mn, 0.05% Cu, and 0.04% C by mass.

Cutting speed: 75 m/min.

Cutting depth: 1.1 mm

Feed: 0.09 mm/tooth.

Under such conditions, the Ni-based alloy was served to a wet-type high-speed high-feed cutting test (cf.: normal cutting speed and feed were 25 to 40 m/min. and 0.08 mm/tooth, respectively). The workpiece was cut until 1.8 m cutting length (test cutting length), and the flank wear width was measured. The worn-out state of the cutting edge was also observed The results of the test is shown in Table 5.

Cutting Condition B:

Workpiece: A 60 mm wide by 200 mm long block having a composition of Ti (base). 6% Al, and 4% V.

Cutting speed: 90 m/min

Cutting depth: 1.1 mm

Feed: 0.09 mm/tooth

Under such conditions, the Ti-based alloy was served to a wet-type high-speed high-feed cutting test (cf.: normal cutting speed and feed were 30 to 45 m/min. and 0.08 mm/tooth, respectively). The workpiece was cut until 1.8 m cutting length (test cutting length), and the flank wear width was measured. The worn-out state of the cutting edge was also observed The results of the test is shown in Table 6.

TABLE 5

| Type | | Cutting Condition A | |
|---|---|---|---|
| | | Wear on flank surface (mm) | Chipping |
| Example | 1 | 0.17 | Not found |
| | 2 | 0.16 | Not found |
| | 3 | 0.13 | Not found |
| | 4 | 0.17 | Not found |
| | 5 | 0.14 | Not found |
| | 6 | 0.18 | Not found |
| | 7 | 0.17 | Not found |
| | 8 | 0.20 | Not found |
| | 9 | 0.21 | Not found |
| Comparative Example | 1 | 1.2 | Observed |
| | 2 | 1.4 | Observed |
| | 3 | *240 | Observed |
| | 4 | *200 | Observed |

*indicates the cutting life (sec) of the sample that has reached its service life before reaching the cutting length.

TABLE 6

| Type | | Cutting Condition B | |
|---|---|---|---|
| | | Wear on flank surface (mm) | Chipping |
| Example | 1 | 0.20 | Not found |
| | 2 | 0.19 | Not found |
| | 3 | 0.20 | Not found |
| | 4 | 0.18 | Not found |
| | 5 | 0.19 | Not found |
| | 6 | 0.20 | Not found |
| | 7 | 0.20 | Not found |
| | 8 | 0.25 | Not found |
| | 9 | 0.24 | Not found |
| Comparative Example | 1 | 1.2 | Observed |
| | 2 | 1.5 | Observed |
| | 3 | *250 | Observed |
| | 4 | *210 | Observed |

*indicates the cutting life (sec) of the sample that has reached its service life before reaching the cutting length.

The results shown in Tables 5 and 6 demonstrate that Examples 1 to 9 exhibit no abnormal damage, such as chipping or delamination, under either cutting condition A or B, indicating high welding resistance and chipping resistance.

In contrast, Comparative Examples 1 to 4 have reached their lifetimes within a short time due to occurrence of chipping or progression of wear on the flank surface under both cutting conditions A and B.

The disclosed embodiments are in all respects exemplary and not restrictive; the scope of the present invention is indicated by the claims, not by the embodiments, and is intended to include all variations within the meaning and scope of the claims and equivalents.

INDUSTRIAL APPLICABILITY

The surface coated cutting tool of the present invention can be used not only for cutting of various steels under normal cutting conditions, but also for high-speed cutting of, for example, titanium alloys and nickel alloys involving high heat generation and high load applied to the cutting edge. The cutting tool exhibits high resistance against welding and chipping, and shows excellent cutting performance over a long period of time. Such cutting tool can accordingly respond to the higher performance of cutting machines, labor saving and energy saving in cutting processes, and cost reduction.

REFERENCE SIGNS LIST

1 substrate
2 binder phase
3 WC grain
4 interfacial layer
5 Region A
6 Region B

The invention claimed is:

1. A surface coated cutting tool comprising a substrate and a coating layer on the substrate, the substrate comprising a WC-based cemented carbide comprising a hard phase component of WC grains and a binder phase primarily composed of Co, wherein (a) an interfacial layer is disposed between the substrate and the coating layer;

(b) the interfacial layer includes a region A that has a W content $W_A$ and a C content $C_A$ directly above the hard phase component and a region B that has a W content $W_B$ and a C content $C_B$ directly above the binder phase, and the interfacial layer has an average thickness;

at the one-half point of the average thickness of the interfacial layer, the W content $W_A$ in the region A is in the range of 90 to 99 mass % and the C content is $C_A$, while the W content $W_B$ in the region B is in the range of 30 to 65 mass % and the C content is $C_B$, the C content $C_A$ in the region A satisfies the expression: $C_A \leq 0.05$ mass %, and the C content $C_B$ in the region B satisfies the expression: $C_A \leq C_B \leq 0.09$ mass %.

2. The surface coated cutting tool set forth in claim 1, wherein the one-half point of the average thickness in the region A further contains 1 to 10 mass % Cr, and the one-half point of the average thickness in the region B further contains 30 to 60 mass % Co and 5 to 10 mass % Cr.

* * * * *